(12) United States Patent
Swartzendruber et al.

(10) Patent No.: US 7,626,794 B2
(45) Date of Patent: *Dec. 1, 2009

(54) SYSTEMS, METHODS, AND APPARATUS FOR INDICATING FAULTS WITHIN A POWER CIRCUIT UTILIZING DYNAMICALLY MODIFIED INRUSH RESTRAINT

(75) Inventors: Ryan W. Swartzendruber, Prospect Heights, IL (US); Laurence V. Feight, Island Lake, IL (US); Tyson J. Salewske, Vernon Hills, IL (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 459 days.

This patent is subject to a terminal disclaimer.

(21) Appl. No.: 11/582,256

(22) Filed: Oct. 16, 2006

(65) Prior Publication Data

US 2007/0086140 A1 Apr. 19, 2007

Related U.S. Application Data

(60) Provisional application No. 60/727,765, filed on Oct. 18, 2005.

(51) Int. Cl.
*H02H 7/00* (2006.01)
(52) U.S. Cl. .................................... 361/93.1
(58) Field of Classification Search ................ 361/93.1
See application file for complete search history.

(56) References Cited

U.S. PATENT DOCUMENTS

| | | |
|---|---|---|
| 3,676,740 A | 7/1972 | Schweitzer |
| 3,702,966 A | 11/1972 | Schweitzer |
| 3,708,724 A | 1/1973 | Schweitzer |
| 3,715,742 A | 2/1973 | Schweitzer |
| 3,725,832 A | 4/1973 | Schweitzer |
| 3,781,682 A | 12/1973 | Schweitzer |
| 3,816,816 A | 6/1974 | Schweitzer |
| 3,866,197 A | 2/1975 | Schweitzer |
| 3,876,911 A | 4/1975 | Schweitzer |
| 3,906,477 A | 9/1975 | Schweitzer |
| 4,063,171 A | 12/1977 | Schweitzer |
| 4,152,643 A | 5/1979 | Schweitzer |
| 4,234,847 A | 11/1980 | Schweitzer |
| 4,375,617 A | 3/1983 | Schweitzer |
| 4,438,403 A | 3/1984 | Schweitzer |
| 4,456,873 A | 6/1984 | Schweitzer |
| 4,458,198 A | 7/1984 | Schweitzer |
| 4,495,489 A | 1/1985 | Schweitzer |
| 4,794,329 A | 12/1988 | Schweitzer |
| 4,794,331 A | 12/1988 | Schweitzer |
| 4,794,332 A | 12/1988 | Schweitzer |
| 4,795,982 A | 1/1989 | Schweitzer |
| 4,873,706 A | 10/1989 | Schweitzer |
| 4,904,932 A | 2/1990 | Schweitzer |

(Continued)

*Primary Examiner*—Stephen W Jackson
(74) *Attorney, Agent, or Firm*—Eugene M. Cummings, P.C.

(57) ABSTRACT

A faulted circuit indicator comprises a processor, which dynamically determines a conductor de-energization level based on a monitored average current. This dynamically-determined de-energization level and/or monitored average current may be used to provide dynamic inrush restraint and/or dynamic backfeed restraint (reset restraint). If current within a power conductor falls below the determined de-energization level, the processor determines that the conductor has de-energized, and accordingly ignores high current spikes less than a predetermined duration that occur during re-energization.

9 Claims, 4 Drawing Sheets

U.S. PATENT DOCUMENTS

| | | |
|---|---|---|
| 4,984,124 A | 1/1991 | Yeh |
| 5,008,651 A | 4/1991 | Schweitzer |
| 5,045,778 A | 9/1991 | Thibodeau |
| 5,070,301 A | 12/1991 | Schweitzer |
| 5,077,520 A | 12/1991 | Schweitzer |
| 5,095,265 A | 3/1992 | Schweitzer |
| 5,153,565 A | 10/1992 | Schweitzer |
| 5,168,414 A | 12/1992 | Horstmann |
| 5,180,972 A | 1/1993 | Schweitzer |
| 5,220,311 A | 6/1993 | Schweitzer |
| 5,274,324 A | 12/1993 | Schweitzer |
| 5,363,088 A | 11/1994 | Schweitzer |
| 5,406,195 A | 4/1995 | Schweitzer |
| 5,420,502 A | 5/1995 | Schweitzer |
| 5,677,623 A | 10/1997 | Schweitzer |
| 5,677,678 A | 10/1997 | Schweitzer |
| 5,729,125 A | 3/1998 | Schweitzer |
| 5,754,383 A * | 5/1998 | Huppertz et al. ........... 361/93.4 |
| 5,821,869 A | 10/1998 | Schweitzer |
| 5,889,399 A | 3/1999 | Schweitzer |
| 5,959,537 A | 9/1999 | Banting |
| 5,990,674 A | 11/1999 | Schweitzer |
| 6,014,301 A | 1/2000 | Schweitzer |
| 6,016,105 A | 1/2000 | Schweitzer |
| 6,043,433 A | 3/2000 | Schweitzer |
| 6,133,723 A | 10/2000 | Feight |
| 6,133,724 A | 10/2000 | Schweitzer |
| 6,211,764 B1 | 4/2001 | Schweitzer |
| 6,429,661 B1 | 8/2002 | Schweitzer |
| 6,433,698 B1 | 8/2002 | Schweitzer |
| 6,479,981 B2 | 11/2002 | Schweitzer |
| 6,734,662 B1 | 5/2004 | Fenske |
| 6,798,211 B1 | 9/2004 | Rockwell |
| 6,822,576 B1 | 11/2004 | Feight |
| 6,894,478 B1 | 5/2005 | Fenske |
| 6,949,921 B1 | 9/2005 | Feight |
| 6,963,197 B1 | 11/2005 | Feight |
| 7,023,691 B1 | 4/2006 | Feight |
| 7,053,601 B1 | 5/2006 | Fenske |
| 7,106,048 B1 | 9/2006 | Feight |

* cited by examiner

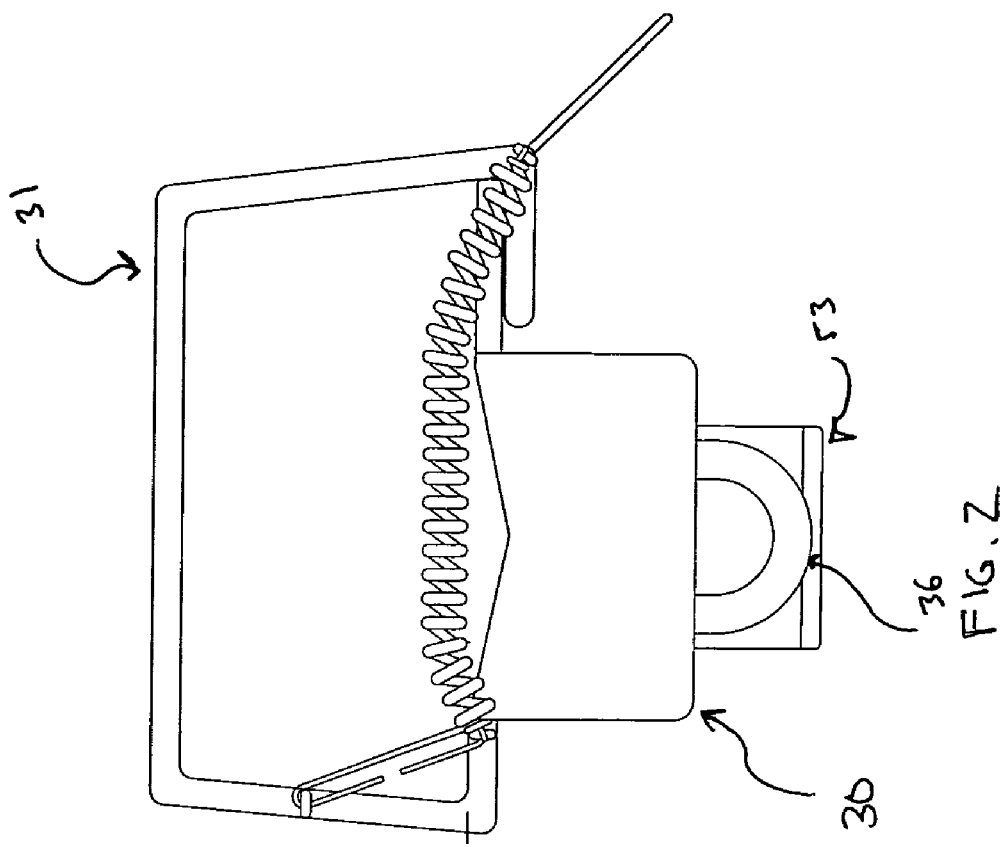
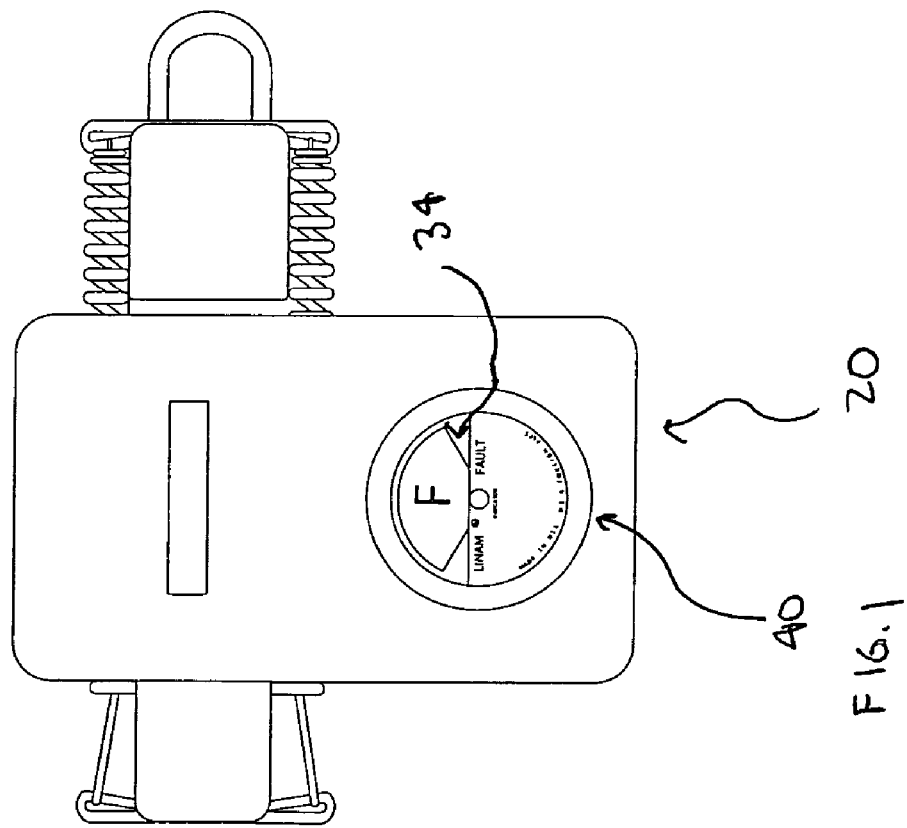

SYSTEMS, METHODS, AND APPARATUS FOR INDICATING FAULTS WITHIN A POWER CIRCUIT UTILIZING DYNAMICALLY MODIFIED INRUSH RESTRAINT

CROSS-REFERENCE TO RELATED APPLICATIONS

This document claims priority under 35 U.S.C. §119(e) to U.S. Provisional Application 60/727,765 Oct. 18, 2005, which is hereby incorporated by reference in its entirety. This application is also related to U.S. application Ser. No. 11/518,334.

FIELD OF THE INVENTION

The present invention relates generally to current sensing devices for electrical systems, and more particularly to fault indication systems that are capable of automatic configuration, and even more particularly to fault indication systems capable of automatically and dynamically configuring an inrush restraint setting.

DESCRIPTION OF THE PRIOR ART

Various types of self-powered fault indicators have been constructed for detecting electrical faults in power distribution systems, including clamp-on type fault indicators, which clamp directly over cables in the systems and derive their operating power from inductive and/or capacitive coupling to the monitored conductor; and test point type fault indicators, which are mounted over test points on cables or associated connectors of the systems and derive their operating power from capacitive coupling to the monitored conductor.

Other prior art fault indicators may be either of the manually resetting type, wherein it is necessary that the indicators be physically reset, or of the self-resetting type, wherein the indicators are reset upon restoration of line current. Examples of such fault indicators are found in products manufactured by E.O. Schweitzer Manufacturing Company and in U.S. Pat. Nos. 3,676,740, 3,906,477, 4,063,171, 4,234,847, 4,375,617, 4,438,403, 4,456,873, 4,458,198, 4,495,489, 4,974,329, 5,677,678, 6,016,105, 6,133,723, 6,133,724, and 6,949,921.

Detection of fault currents in a monitored conductor by a fault indicator is typically accomplished by magnetic switch means, such as a magnetic reed switch, in close proximity to the conductor being monitored. Upon occurrence of an abnormally high fault-associated magnetic field around the conductor, the magnetic switch actuates a trip circuit that produces current flow in a trip winding to position an indicator flag visible from the exterior of the indicator to a trip or fault indicating position. Upon restoration of current in the conductor, a reset circuit is actuated to produce current flow in a reset winding to reposition the target indicator to a reset or non-fault indicating position, or the fault indicator may be manually reset. Some prior art fault indicators also utilize light emitting diodes (LEDs) to display a fault condition.

Conductors in power systems are sometimes de-energized for indeterminate periods by protective devices or for maintenance. When a particular power line is opened, the current in the line will decline, but will not immediately transition to zero. Stored energy in the power system periphery will discharge over a period of time resulting in residual current in the power line. Also, some power system configurations can remove energy from only one phase of the power system. In some cases a single phase with power system energy removed can have residual current flow acquired through the other two energized phases via inductive coupling. Residual current flow in a power line is referred to as backfeed current.

Devices that are attached to a de-energized power line may, for a brief period of time, draw large amounts of inrush current when the line is reenergized. To properly detect the de-energization of the power line and subsequently ignore large currents when power system energy is restored, prior art fault indicators have used a fixed threshold below which the system is considered de-energized. These fault indicators ignore large current levels for some period of time after the line is re-energized. In some instances prior art fault indicators will mistake high backfeed current levels for an energized line. In these cases, the prior art fault indicators either do not detect de-energization, or return from the de-energized state before the line is actually energized.

OBJECTS OF THE INVENTION

Accordingly, it is an object of this invention is to provide an improved fault indicator that better detects when a line has been de-energized and then subsequently re-energized, so that the fault indicator can properly classify a normal brief high current situation as inrush that is expected on line re-energization rather than as a fault.

SUMMARY OF THE INVENTION

The disclosed invention achieves its objectives through the use of dynamically determined power conductor de-energization levels. A faulted circuit indicator comprises a housing including a current acquisition circuit, such as a current transformer, adapted to monitor current within a power conductor. An averaging circuit is coupled to a processor, which dynamically determines a conductor de-energization level based on the average current. If the monitored current falls below the determined de-energization level, the processor determines that the conductor has de-energized, and accordingly ignores high current spikes less than a predetermined duration, thereby achieving dynamic inrush restraint.

BRIEF DESCRIPTION OF THE DRAWINGS

Although the characteristic features of this invention will be particularly pointed out in the claims, the invention itself, and the manner in which it can be made and used, can be better understood by referring to the following description taken in connection with the accompanying drawings forming a part hereof, wherein like reference numerals refer to like parts throughout the several views and in which:

FIG. 1 is a front view of a fault indicator constructed in accordance with the present invention.

FIG. 2 is a top view of the fault indicator of FIG. 1.

DETAILED DESCRIPTION OF THE ILLUSTRATED EMBODIMENTS

Figure 3:
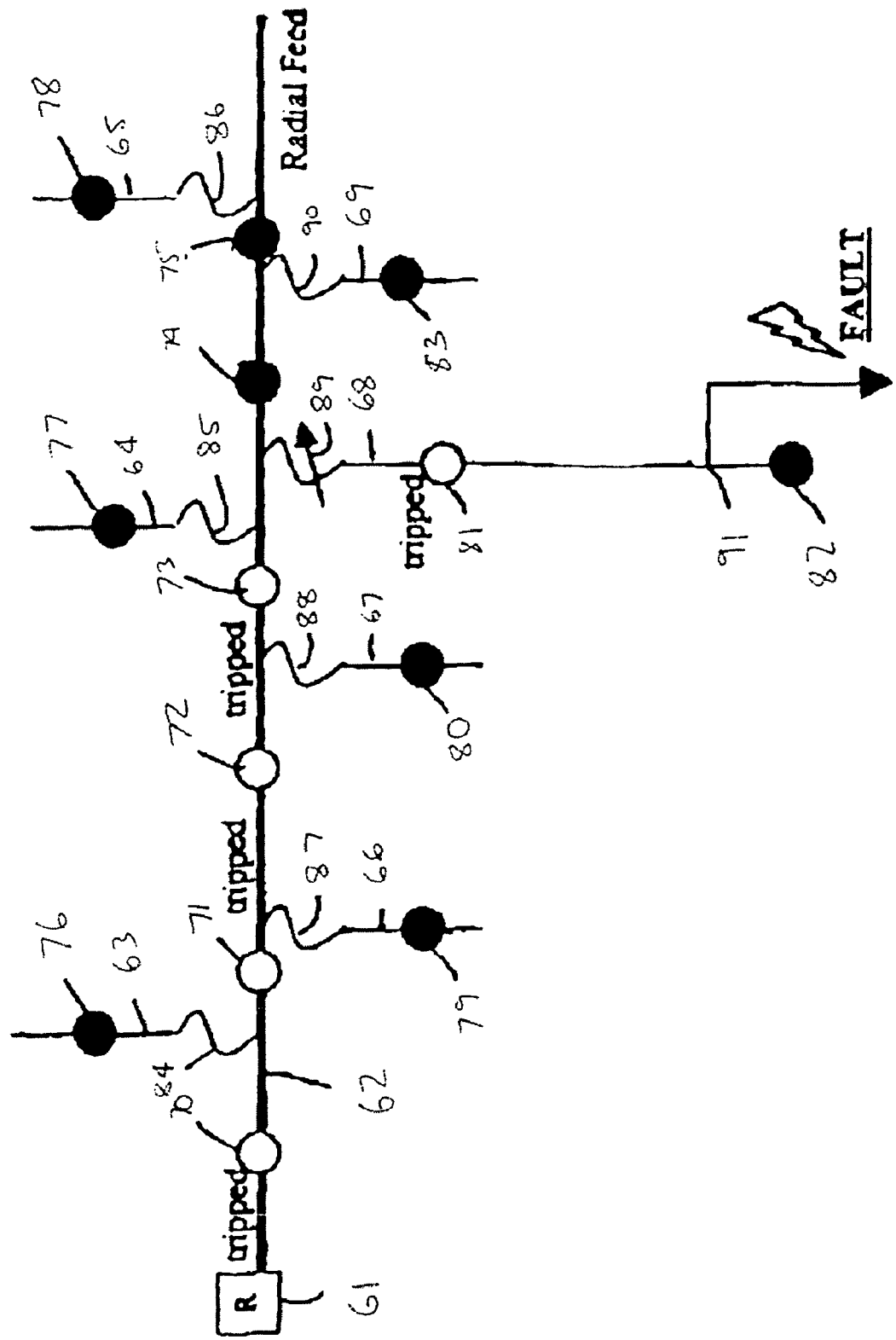
FIG. 3 is a diagrammatic illustration of an electrical distribution system employing a plurality of fault indicators to assist in locating a fault on the system.

Referring to the Figures, and particularly to FIG. 1, a faulted circuit indicator, generally designated 20, is constructed in accordance with the invention. Fault indicator 20 indicates fault currents in an electrical feeder or distribution cable (not shown). Faulted circuit indicator includes a housing 30 (FIG. 2) that contains electronic circuitry for sensing and responding to fault currents in a monitored power cable (not shown). A current transformer 31 couples the faulted circuit indicator to the monitored conductor.

The structure and operation of this circuitry is discussed below. An eye 36 on an end cap 53 may be provided to allow use of a conventional hot stick during installation or removal of fault indicator 20. When installed on a cable, fault indicator 20 normally hangs so that a face 40 containing the status indicator 34 is easily viewed from by service personnel. Housing 30 and end cap 53 may be formed from any suitable material, such as plastic. End cap 53 forms part of the housing 30, and may be sonically welded to housing 30 to seal the interior of fault indicator 20 against contamination.

In order to better understand some of the aspects of the present invention, the application of faulted circuit indicator 20 in an electrical distribution system will now be considered. Turning now to FIG. 3, a portion of an electrical distribution system, generally designated 60, is controlled by a reclosing relay 61. Electrical distribution system 60 may be of the radial feed type including a main line 62 and a plurality of radial lines 63-69. Main line 62 is typically a higher voltage overhead line. Radial lines 63-69 are typically lower voltage underground lines used in residential applications. For example, lines 63-69 often surface from their underground location at transformers in pad mounted enclosures. A plurality of fault indicators 70-82 is employed on the main and radial lines to assist in any fault that may occur on the system 60. If fault indicators are located on the main line between each radial feed line and on each radial feed line, the fault can be located by following the tripped or fault-indicating indicators 70-82.

In the example of FIG. 3, the tripped fault indicators 70-73 and 81 are shown with white centers. The untripped or reset fault indicators are shown with black centers. The system 60 also employs a plurality of fuses 84-90; one for each of the radial lines 63-69. In this example, a fault at a point 91, such as to ground, in line 68 is easily isolated by a lineman following the tripped fault indicators 70-73 and 81 as being between tripped fault indicator 81 and untripped fault indicator 82. Note that the fault at point 91 has also caused fuse 89 to blow or open.

Reclosing relays, such as relay 61, attempt to restore power to the distribution system 60 after a predetermined time, such as 200-350 milliseconds (ms). Relay 61 may close for about 200-350 ms, and if the fault persists, relay 61 will again reopen for another 200-350 ms. If the fault remains after about three reclosing attempts, the relay 61 will remain in an open or locked out condition. In the example of FIG. 3, the relay 61 is likely to succeed in the first reclosing attempt because the blown fuse 89 now electrically isolates line 68, including the fault at point 91, from the remainder of the distribution system 60.

However, if fault indicators 70-73 are of the type that automatically reset upon the restoration of line current, fault indicators 70-73 will be reset before a lineman can view these fault indicators. Thus, fault indicators 70-73 will not assist in quickly isolating the fault on the system 60. Instead, the lineman will have to try to find tripped fault indicator 81 and/or blown fuse 89.

Fault indicator 20 has a timed reset function which is designed to trigger reset of the display some hours after a fault occurs. Thus, in the example of FIG. 3, fault indicators 70-73 continue to display the fault on indicator 34 after reclosing relay 61 restores current to main line 62. This enables a lineman to trace the fault by following fault indicators 70 through 73 and 81 to a section of the line between fault indicators 81 and 82. The point of the fault 91 may then be located and repaired, or line 68 may be replaced. As will be understood hereinafter, the length of the timed reset may be in the range of 1 to 24 or more hours, and is preferably about 4 hours. Four hours normally provides sufficient time for a lineman or repair crew to review the tripped fault indicators to determine the part of the distribution system that has caused the fault.

Rather than waiting for the predetermined reset time to elapse, fault indicator 20 may be manually reset at any time. To this end, a reset magnetic reed switch is disposed in the housing 30 of FIG. 2, preferably at a generally perpendicular angle to conductor. Magnetic reed switch may be manually closed with a permanent magnet tool in a manner known to the art.

Figure 4:
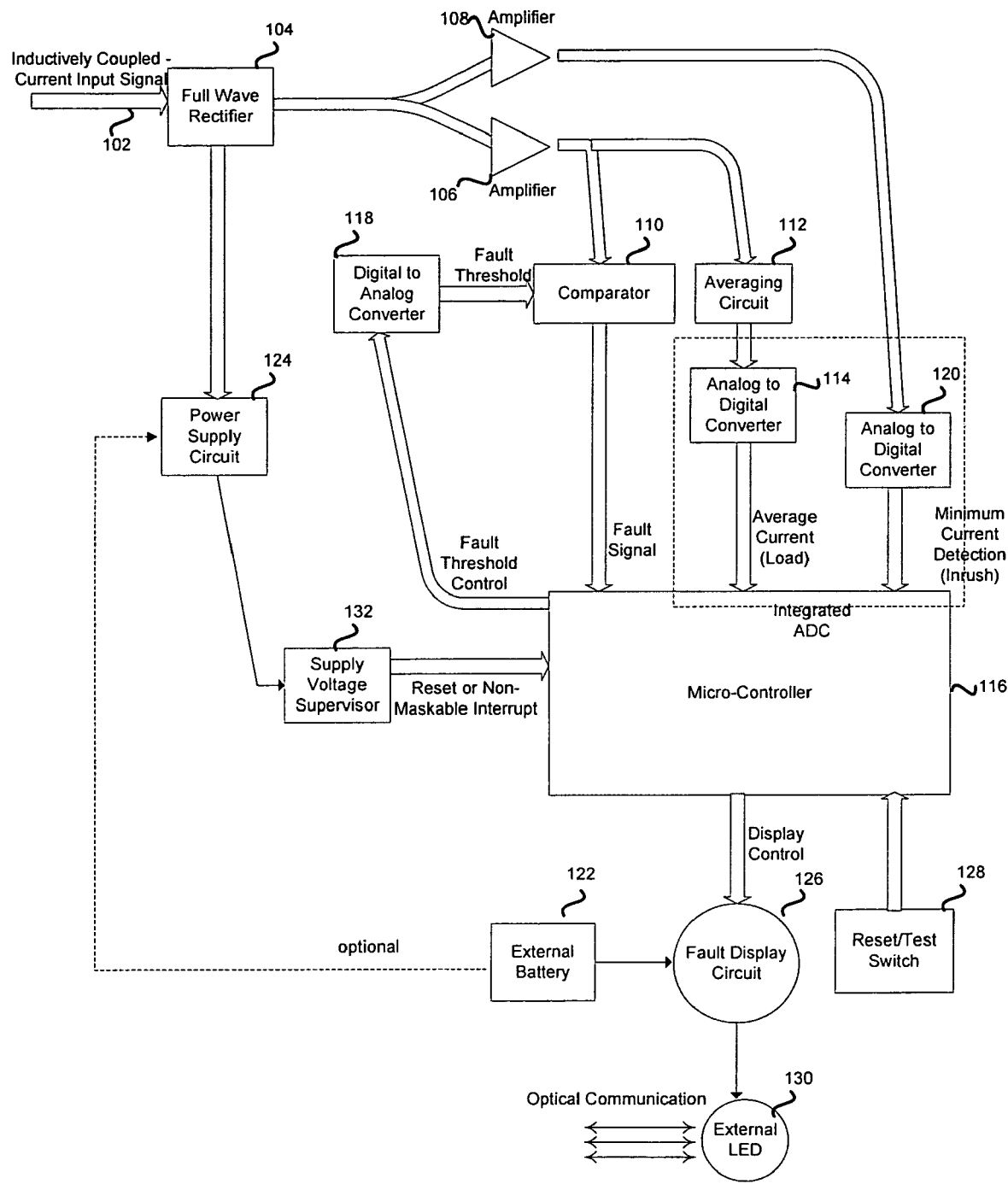
FIG. 4 is a block diagram view of the operative circuitry of an embodiment of the disclosed faulted circuit indicator.

FIG. 4 is a block diagram of the electronic circuitry, generally designated 100, of the disclosed fault indicator. A current acquisition circuit (not shown), which may include a current transformer, senses current in a monitored conductor including any fault currents. The acquired/monitored current 102 passes through a full wave rectifier 104, and into a pair of amplifiers 106 and 108. The output of amplifier 106 is routed to comparator 110, which generates a fault signal in the manner described below. The output of amplifier 106 is also routed through an averaging circuit 112, and then into an analog to digital converter (ADC) 114 which may be an inherent accessory of processor 116. Alternatively, averaging circuit 112 may not be present, and processor 116 will determine the instantaneous and average current using algorithms well known in the art. Based on the measured average current, processor 116 will program a digital to analog converter (DAC) 118 to generate an input signal to comparator 110.

The output from amplifier 106 is tied to the positive input terminal of comparator 110. The negative input terminal of comparator 110 is sourced by DAC 118, which is programmed by processor 116. In this way, processor 116 can control the threshold level of comparator 110. Adjusting the threshold of comparator 110 directly controls the fault current threshold (i.e.; the level of current in the monitored conductor that is considered a fault) and provides the means for autoranging.

The output of amplifier 108 is shown being passed through a second ADC 120. Note that a single ADC and a multi-position analog switch could be used as well. Processor 116 uses the input from this second ADC 120 to monitor the peak current detected by the current acquisition circuit approximately once every half cycle period. If the monitored peak current is not sufficiently large, processor 116 will record the time. If the monitored peak current is of sufficiently small magnitude for a predetermined time period the processor 116 will place the fault indicator into system detect state, which is the method in which inrush lockout is accomplished. System detect state is discussed later in the application. The particular magnitude below which the current must fall before system detect state is triggered is determined by the value of the monitored average current. Addtionally, the fault threshold which is determined from the monitored average current is saved in the processor non-volatile memory such that the re-energization level will be configured in the event that the processor loses power during an outage.

FIG. 4 also shows an optional external battery 122, which can provide backup power to power supply circuit 124, processor 116, display control 126, or some subset thereof. Power supply circuit 124, which consists of one or more DC regulators and required support circuitry, provides regulated power to all circuits in the fault indicator. It receives unregulated power from either external battery 122 or full wave rectifier 104. Supply voltage supervisor 132 monitors the power quality of power supplied by power supply circuit 132 and forces processor 116 into reset if the quality of the supplied power is inadequate. In addition, FIG. 1 shows display controller 126, which is controlled by processor 116. The actual display could be, for example, LEDs or a mechanical rotor display. FIG. 1 also shows reset/test switch 128. Reset/test switch 128 allows maintenance personnel to manually reset the fault indicator and clear any faults, or, if no faults have been noted, to test the operation of the fault indicator and ensure that it can properly display the occurrence of any faults.

FIG. 4 also shows external LED 130 coupled to and controlled by processor 116. External LED 130 is a means to optically communicate with a remote computer or other device monitoring the battery level of the fault indicator. Such communications could take place over fiber-optic lines. In response to various circuit conditions, processor 116 activates display control 126 to indicate that a permanent or temporary fault has occurred. In addition, the fault indicator can optionally provide a SCADA output signal (not shown), which would also be controlled by processor 116. If the fault indicator is of the targeted type processor 116 can set the target to the fault indicating condition, or it can reset the target to the normal condition after a timed reset interval. Processor 116 may optionally display information on a seven-segment display, such as the amount of elapsed time since a fault occurred. Processor 116 may also be optionally provided with a radio frequency (RF) link to report status information to a data or communication system at a remote location, such as a system for monitoring the electrical distribution system that employs a plurality of fault indicators.

The disclosed invention also makes use of inrush restraint. Inrush restraint is a period of time during which currents that exceed the trip threshold are ignored. As this behavior is not usually desirable, inrush restraint is observed only when the monitored conductor shifts from a de-energized state into an energized state. To properly detect the de-energization of the powerline and subsequently ignore large currents when the power system energy is restored, the fault indicator disclosed herein makes use of a fixed current threshold below which the monitored conductor will be considered de-energized, i.e.; a de-energization current level. The detection of de-energized state will trigger inrush restraint. The fault indicator will not indicate the presence of faults until the monitored conductor has become re-energized and remained so for some time period. After the fault indicator has entered "inrush restraint mode," the current in the monitored conductor must rise above some minimum threshold before the monitored conductor will be considered re-energized, i.e.; a re-energization current level. This level must be set sufficiently high to prevent the fault indicator from considering the monitored conductor re-energized due to backfeed currents.

One factor that distinguishes this invention from presently available fault indicators is the dynamic determination of both the de-energization level and the re-energization level. Conductors with higher monitored average current will have a correspondingly higher de-energization current level. The determination of the de-energization level could be the result of a formulaic calculation, or, alternatively, it could be the result of comparing the average measured current to a collection of values specifying the upper and lower bounds of acceptable current for a given de-energization current level. For instance, the de-energization level could be specified as 5% of the present fault threshold. Therefore, if the faulted circuit indicator had determined that 900A would constitute a fault on the monitored power line, the de-energization level could be set to 45A. In addition, conductors with a higher monitored average current level can be expected to have a higher amount of backfeed current, and therefore require a correspondingly higher re-energization level. The determination of the re-energization level could be the result of a formulaic calculation, or, alternatively, it could be the result of comparing the average measured current to a collection of values specifying the upper and lower bounds of acceptable current for a given re-energization current level. Setting the energization level equal to the de-energization level produces acceptable results in most circumstances.

Figure 5:
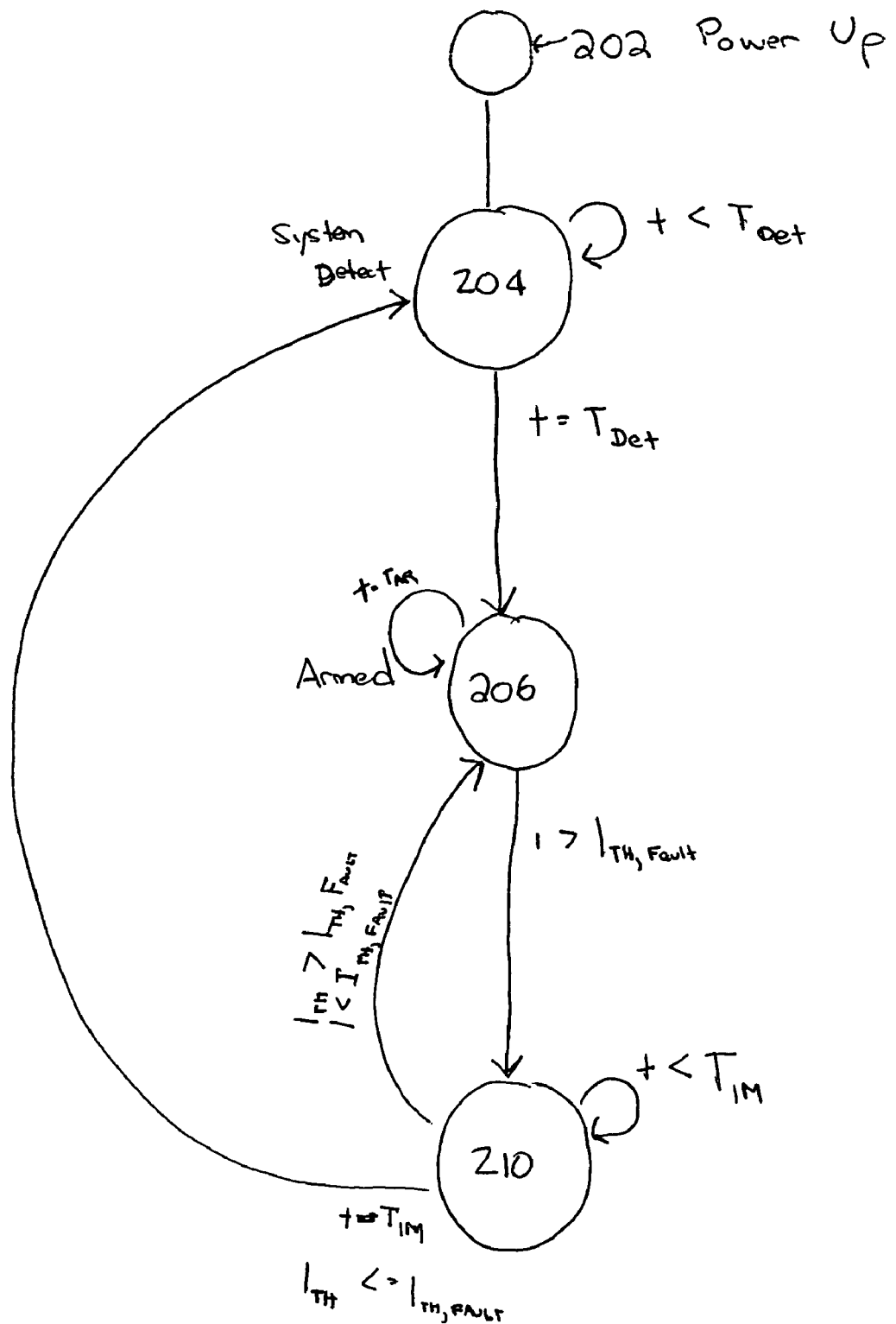
FIG. 5 is a simplified state diagram illustrating the operating states of a processor disposed within the disclosed fault indicator.

FIG. 5 is a simplified state diagram 200 illustrating the primary operating states of processor 116. On powerup, processor 116 starts in power up state 202. Processor 116 then transitions to system detect state 204.

In system detect state 204, processor 116 determines if the monitored conductor is in an energized state, where an energized state is defined as the continuous detection of current higher than the energization level for a period of time equal to $T_{DET}$, which may be 2 minutes, or another user configured time period. If no current equal to the energization level is present for a predetermined time, processor 116 may begin to relax its minimum current requirement. This is designed to prevent processor 116 from improperly remaining in system detect state 204. The following table shows one possible schedule of currents and times which will trigger passage into armed state 206.

| Energization Level Rampdown Table | |
| --- | --- |
| t < 4 hours | $I_{ENERGIZATION}(I_{TH})$ |
| 4 hours ≦ t < 5 hours | $I_{ENERGIZATION}$ (900 A) |
| 5 hours ≦ t < 6 hours | $I_{ENERGIZATION}$ (600 A) |
| 6 hours ≦ t < 7 hours | $I_{ENERGIZATION}$ (450 A) |
| 7 hours ≦ t < 8 hours | $I_{ENERGIZATION}$ (300 A) |
| 8 hours ≦ t < 9 hours | $I_{ENERGIZATION}$ (200 A) |
| 9 hours ≦ t < 10 hours | $I_{ENERGIZATION}$ (100 A) |
| 10 hours ≦ t | $I_{ENERGIZATION}$ (50 A) |

As the trip level of the disclosed fault indicator is also dynamically set based on the detected fault current as disclosed in U.S. Pat. No. 6,949,921, assigned to the same assignee of this application and incorporated herein by reference, the trip level is also initially determined in the system detect state 204 as disclosed in the '921 patent. In addition, in system detect state 204 the fault indicator ignores what would be classified as fault events, thereby accomplishing inrush restraint.

Once the fault indicator has entered the armed state 206, processor 116 will begin to conduct the primary activities of the fault indicator. These include monitoring the output of the current acquisition circuit, determining if a fault has occurred, determining the average current in the monitored conductor, determining an appropriate trip level based on the average current, determining an appropriate delayed trip response time based on the average current, determining an appropriate inrush restraint level based on the average current, maintaining communications with a remote monitor, and monitoring reset/test switch 128 to determine if an operator wants to test the fault indicator's fault display. In addition, processor 116 can choose a new trip level (i.e.; can autorange) whenever elapsed time t equals autoranging period $T_{AR}$.

Processor 116 can leave armed state 206 through the occurrence of a number of different events. One way for processor 116 to leave armed state 206 is if the monitored current falls below the de-energization level. On occurrence of this event, processor 116 will transition to system detect state 204. Another way that processor 116 can leave armed state 206 is if a fault is detected. If a fault is detected, the system will transition to intermediate fault state 210.

In the intermediate fault state 210, the fault indicator determines whether the detected fault is a transient occurrence, or whether a permanent fault has occurred. On entrance to intermediate fault state 210, an intermediate fault event is recorded and the detection of a fault is displayed. If the monitored fault current falls below the fault threshold, $I_{TH,FAULT}$, or an operator reset is detected, then the system will transition back to armed state 206. If the monitored current does not subside during intermediate fault state 210, the system must determine whether the increased current is a result of a sustained increase in load, or an actual fault. This is accomplished by continuing to execute the algorithm that determines the appropriate fault level for the monitored load current as disclosed in the aforementioned '921 patent. If it is determined that the increased current is a result of a sustained increase in current in the monitored conductor, the system will reset the fault display and return to the armed state 206. However, if the measured load current at the end of intermediate fault state 210 duration, $T_{IM}$, does not result in a greater fault threshold, the fault indicator reenters system detect state 204, and a fault display continues.

The foregoing description of the invention has been presented for purposes of illustration and description, and is not intended to be exhaustive or to limit the invention to the precise form disclosed. The description was selected to best explain the principles of the invention and practical application of these principles to enable others skilled in the art to best utilize the invention in various embodiments and various modifications as are suited to the particular use contemplated. It is intended that the scope of the invention not be limited by the specification, but be defined by the claims set forth below.

I claim:

1. A faulted circuit indicator for detecting abnormally high current levels on a power conductor comprising:
    i) a housing;
    ii) a current acquisition circuit disposed within said housing and adapted to monitor current within said power conductor;
    iii) an averaging circuit for generating an average current, said averaging circuit disposed within said housing and coupled to said current acquisition circuit; and
    iv) a processor coupled to said current acquisition circuit and said averaging circuit, said processor generating a de-energization level based on said average current and ignoring abnormally high current levels on said power conductor for a predetermined time after said monitored current rises above said de-energization level.

2. The faulted circuit indicator of claim 1, wherein said processor determines a trip level based on said average current and wherein said de-energization level is set to a mathematical function related to said trip level.

3. The faulted circuit indicator of claim 2, wherein said de-energization level is set to 5% of said trip level.

4. A method for detecting abnormally high current levels as a result of inductive load inrush on a power conductor comprising the steps of:
    i) monitoring a current level within said power conductor;
    ii) determining an average current;
    iii) generating a de-energization level based on said average current; and
    iv) ignoring abnormally high current levels on said power conductor for a predetermined time after said monitored current rises above said de-energization level.

5. The method of claim 4, further comprising the step of generating a trip level based on said average current, and wherein said de-energization level is set to a fraction of said trip level.

6. The method of claim 5, wherein the de-energization level is set to 5% of said trip level.

7. A faulted circuit indicator for detecting abnormally high current levels on a power conductor comprising:
    i) means for monitoring a current level within said power conductor;
    ii) means for determining an average current;
    iii) means for generating a de-energization level based on said average current; and
    iv) means for ignoring abnormally high current levels on said power conductor for a predetermined time after said monitored current rises above said de-energization level.

8. The faulted circuit indicator of claim 7, further comprising means for generating a trip level, and wherein said de-energization level is set to a fraction of said trip level.

9. The faulted circuit indicator of claim 8, wherein said de-energization level is set to 5% of said trip level.

* * * * *

UNITED STATES PATENT AND TRADEMARK OFFICE
CERTIFICATE OF CORRECTION

| | |
|---|---|
| PATENT NO. | : 7,626,794 B2 |
| APPLICATION NO. | : 11/582256 |
| DATED | : December 1, 2009 |
| INVENTOR(S) | : Swartzendruber et al. |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 505 days.

Signed and Sealed this

Second Day of November, 2010

David J. Kappos
*Director of the United States Patent and Trademark Office*